United States Patent
Touzni et al.

(10) Patent No.: US 8,286,057 B2
(45) Date of Patent: *Oct. 9, 2012

(54) ITERATIVE DECODING OF PACKET DATA

(75) Inventors: Azzedine Touzni, Algonquin, IL (US); Ravikiran Rajagopal, Yardley, PA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 625 days.

This patent is subject to a terminal disclaimer.

(21) Appl. No.: 12/426,513

(22) Filed: Apr. 20, 2009

(65) Prior Publication Data

US 2009/0217138 A1 Aug. 27, 2009

Related U.S. Application Data

(63) Continuation of application No. 11/282,413, filed on Nov. 18, 2005, now Pat. No. 7,530,007.

(60) Provisional application No. 60/629,433, filed on Nov. 19, 2004.

(51) Int. Cl.
*H03M 13/00* (2006.01)
(52) U.S. Cl. .................. 714/776; 714/774
(58) Field of Classification Search ............... 714/776, 714/774

See application file for complete search history.

(56) References Cited

U.S. PATENT DOCUMENTS

| | | |
|---|---|---|
| 5,136,716 A | 8/1992 | Harvey et al. |
| 5,152,000 A * | 9/1992 | Hillis .................. 712/11 |
| 5,745,837 A | 4/1998 | Fuhrmann |
| 6,192,500 B1 | 2/2001 | Yang et al. |
| 6,260,167 B1 | 7/2001 | Lo et al. |
| 6,289,000 B1 | 9/2001 | Yonge, III |
| 6,671,284 B1 * | 12/2003 | Yonge et al. ............. 370/462 |
| 6,785,227 B1 | 8/2004 | Lu et al. |
| 6,799,026 B1 | 9/2004 | Scherzer et al. |

(Continued)

FOREIGN PATENT DOCUMENTS

WO  WO 03/049397  12/2003

(Continued)

OTHER PUBLICATIONS

European Telecommunication Standards Institute, "Digital Video Broadcasting (DVB); Framing Structure, Channel Coding and Modulation for Digital Terrestrial Television", ETSI EN 300 744, V1.5.1, (Nov. 2004).

(Continued)

*Primary Examiner* — M. Mujtaba K Chaudry
(74) *Attorney, Agent, or Firm* — Volpe and Koenig, P.C.

(57) ABSTRACT

A receiver employs iterative decoding of packet data, where the packet data represents a data frame encoded with at least two logical dimensions. A logical dimension refers to a layer, or sub-layer, of a layered network architecture. Consequently, a first logical dimension of encoding might refer to error detection in a packet frame at the data link layer, while a second logical dimension of coding might refer to error detection/correction encoding at a physical layer. For example, a data frame might be divided into several packets, each with a corresponding cyclic redundancy check (CRC) value as coding in the first logical dimension, which are then transmitted with a convolutional code as coding in the second logical dimension. The receiver performs iterative decoding in the first and second logical dimensions until either i) all errors are identified and corrected or ii) another type of stopping condition is met.

18 Claims, 5 Drawing Sheets

U.S. PATENT DOCUMENTS

| | | | |
|---|---|---|---|
| 6,851,083 | B1 | 2/2005 | Hagenauer et al. |
| 6,885,679 | B1 | 4/2005 | Cheong et al. |
| 7,249,304 | B2 | 7/2007 | Yu et al. |
| 2002/0178417 | A1 | 11/2002 | Jacob et al. |
| 2005/0097429 | A1 | 5/2005 | Propp et al. |

FOREIGN PATENT DOCUMENTS

| | | |
|---|---|---|
| WO | WO 2004/004133 | 8/2004 |

OTHER PUBLICATIONS

European Telecommunication Standards Institute, "Digital Video Broadcasting (DVB); Transmission System for Handheld Terminals (DVB-H)", ETSI EN 302 304, V1.1.1, (Nov. 2004).

European Telecommunication Standards Institute, "Digital Video Broadcasting (DVB), DBV Specification for Data Broadcasting", ETSI EN 301 192, V1.4.1 (Nov. 2004).

Woerz T. et al, "Iterative Decoding for Multilevel Codes Using Reliability Information", Communication for Global Users Including A Communications Theory Mini Conference, Orlando, Proceedings of the Glocal Telecommunications Conference (Globecom), New York, IEEE, pp. 1779-1784, (Dec. 6-9, 1992).

Papke L. et al., "Different Iterative Decoding Algorithms for Combined Concatenated Coding and Multiresolution Modulation", Communications 1994, ICC '94, Supercomm/ICC '94, Conference Record, 'Serving Humanity Through Communications', IEEE International Conference on New Orleans, LA, New York, NY, pp. 1249-1254 (May 1-5, 1994).

* cited by examiner

| k= | 1 | 2 | 3 | 4 | 5 | 6 | 7 | 8 | 9 | 10 |
|---|---|---|---|---|---|---|---|---|---|---|
| r=1 | | | | | | | (SEG) ED 9 | φ | φ | EDC1 |
| 2 | | | | (SEG) ED 5 | | | | φ | φ | EDC2 |
| 3 | | | | | | | | φ | φ | EDC3 |
| 4 | | (SEG) ED 2 | | | (SEG) ED 6 | | | φ | φ | EDC4 |
| 5 | | | | | | 102 | FE | φ | φ | EDC5 |
| 6 | | | (SEG) ED 4 | | | | | φ | φ | EDC6 |
| 7 | (SEG) ED 1 | | | | | | (SEG) ED 10 | φ | φ | EDC7 |
| 8 | | | | | (SEG) ED 7 | | φ | φ | φ | EDC8 |
| 9 | | | | | | | φ | φ | φ | EDC9 |
| 10 | | | | | | (SEG) ED 8 | φ | φ | φ | EDC10 |
| 11 | | (SEG) ED 3 | | | | | φ | φ | φ | EDC11 |

ITERATIVE DECODING OF PACKET DATA

CROSS REFERENCE TO RELATED APPLICATION

This application claims the benefit of U.S. Nonprovisional Patent Application Ser. No. 11/282,413, filed Nov. 18, 2005, which is incorporated by reference as if fully set forth.

BACKGROUND OF THE INVENTION

1. Field of the Invention

The present invention relates to iterative decoding of encoded, packetized information at a receiver of a digital communications system.

2. Description of the Related Art

In many digital communications systems, user information is processed into an encoded (e.g., error-correction encoded) and/or packetized stream of data. The stream of data is then divided into discrete blocks for transport through a given transmission medium, where such transport might be defined through an operating standard. Often, these discrete blocks are themselves further encoded and/or further packetized for transport over the physical transmission medium. Each occurrence of transport processing might be considered a logical level, or "layer".

Most high-speed digital data applications include logical levels organized as a series of layers, each one built upon its predecessor. The purpose of each layer is to offer services to the higher layers, shielding those layers from implementation details of lower layers. Between each pair of adjacent layers is an interface that defines those services. For example, the International Standards Organization has developed a layered network architecture called the Open Systems Interconnection (OSI) Reference model that has seven layers: application, presentation, session, transport, network, data link, and physical layers. For example, computers communicating through the Internet might use transport control protocol (TCP) at the transport layer, the Internet protocol (IP) at the network layer in TCP/IP packet networks, and logical link control (LLC) at the data link layer. A layer might be further divided into two or more (vertical or horizontal) sub-layers, where each sub-layer is designed to accomplish a specific function.

The function of the lowest level, the physical layer, is to transfer bits over the communication medium. The function of the higher layers (e.g., data link layer) is to partition input data into data frames and transmit the data frames over the lower layers (e.g., physical layer) sequentially. Each data frame usually includes a header that contains control, sequence, and error detection (and possibly error correction) information for the frame.

One high-speed digital data application organized as a series of layers is specified in the digital video broadcast (DVB) standard, currently proposed and in development as a European telecommunications standard. The DVB standard specifies techniques for the transmission of video data, such as MPEG-2 (Moving Pictures Experts Group, phase 2) transport stream (TS) packets. For terrestrial applications, the standard extension is DVB-T (see "Digital Video Broadcasting (DVB); Framing structure, channel coding and modulation for digital terrestrial television," European Broadcasting Union—Union Européenne de Radio-Télévision, ETSI EN 300 744 v1.5.1 (2004), the teachings of which are incorporated herein by reference), while, for handheld (mobile) applications, the standard extension is DVB-H (see "Digital Video Broadcasting (DVB); Transmission System for Handheld Terminals (DVB-H)," European Broadcasting Union—Union Européenne de Radio-Télévision, ETSI EN 302 304 V1.1.1 (2004), the teachings of which are incorporated herein by reference). DVB transports MPEG-2 TS packets as a sequence of datagrams. DVB-H, unlike DVB-T, employs multi-protocol encapsulated (MPE) Internet Protocol (IP) datagrams with forward error correction (FEC). MPE FEC divides the MPEG-2 TS packet into a series of IP datagrams, and encodes the IP datagrams into datagram sections with an FEC code, such as a Reed-Solomon code. Thus, DVB transports data with at least two logical layers: i) the MPEG-2 TS packet layer and ii) a logical layer comprising the MPE IP datagrams (the parsed MPEG-2 packets at a low-level data link layer and the FEC-encoded MPE IP datagrams.

Often, to improve coding gain and decrease a bit error rate (BER) seen at a receiver, multiple-code techniques are used for encoding data at a specific logical layer. Concatenated code systems for encoding and decoding data use two or more component codes that are concatenated during the process of encoding the data. Although the component codes may be of any type, the component codes are typically relatively simple codes such as convolutional codes. The two or more component codes are concatenated either in serial or in parallel. For example, in serial concatenation of two component codes, data is first encoded by a first encoding module with a first component code. This encoded data is, in turn, passed through an interleaver and then applied to a second encoding module for encoding with a second component code. This process operates on only a single, serial data stream, and the first and second component codes may be the same code. In the parallel concatenation, in one processing path data is encoded with the first component code and in the other processing path data is interleaved and then is encoded with a second component code. The two encoded streams are combined in parallel by, for example, interleaving to provide a single encoded data stream, and the first and second component codes may be the same code.

Concatenated code systems may employ iterative decoding of encoded data using either serial or parallel iterative decoding methods. When employing iterative decoding of data encoded with a concatenated code, a block of data is input to the iterative decoder. The block boundaries desirably conform to symbol boundaries of the concatenated code. The iterative decoder may comprise N component code decoders for decoding in accordance with each of the N component codes originally used to encode the data. The particular implementation of the iterative decoder is dependent on whether the encoding process was based on serial or parallel concatenation.

In an iterative decoding method, the complete decoding process during each iteration subjects a block of encoded data to decoding by each of the N component code decoders. The complete decoding process repeats for each iteration until a predetermined number (I) of decoding iterations are complete. A complete, "soft" decoding of the data encoded with a concatenated code is performed during each iteration, (i.e., a decoding with each component code of the concatenated code to generate a soft decision for the bit and a reliability value related to the probability that the soft decision is correct). Each iteration allows for higher confidence in the decisions for bits in the decoded data that are made based on the soft-output values provided from the detector.

However, for iterative decoding schemes, the decoding occurs at a specific logical layer (e.g., the physical layer) with a known relationship between the component codes. This known relationship allows the soft-output values of a decoding of a given component code to be used as a priori information that is used during subsequent decoding of a different component code.

SUMMARY OF THE INVENTION

In accordance with exemplary embodiments, the present invention is a method and apparatus for processing segments of a data frame. In a first logical dimension, one or more unreliable segments of the data frame are detected, wherein each segment of the data frame includes error detection information in accordance with encoding in the first logical dimension. Then, in a second logical dimension, the segments of the data frame are decoded based on (i) the one or more unreliable segments and (ii) error detection/correction information in accordance with encoding in the second logical dimension, wherein the first and second logical dimensions correspond to different layers or sub-layers of a layered network architecture. The processing in the first and second logical dimensions is then repeated for the data frame until a stopping condition is met.

BRIEF DESCRIPTION OF THE DRAWINGS

Other aspects, features, and advantages of the present invention will become more fully apparent from the following detailed description, the appended claims, and the accompanying drawings in which:

FIG. 1 shows an exemplary multi-logical dimension encoding of received data that might be iteratively decoded by the method of FIG. 2;

DETAILED DESCRIPTION

Figure 2:
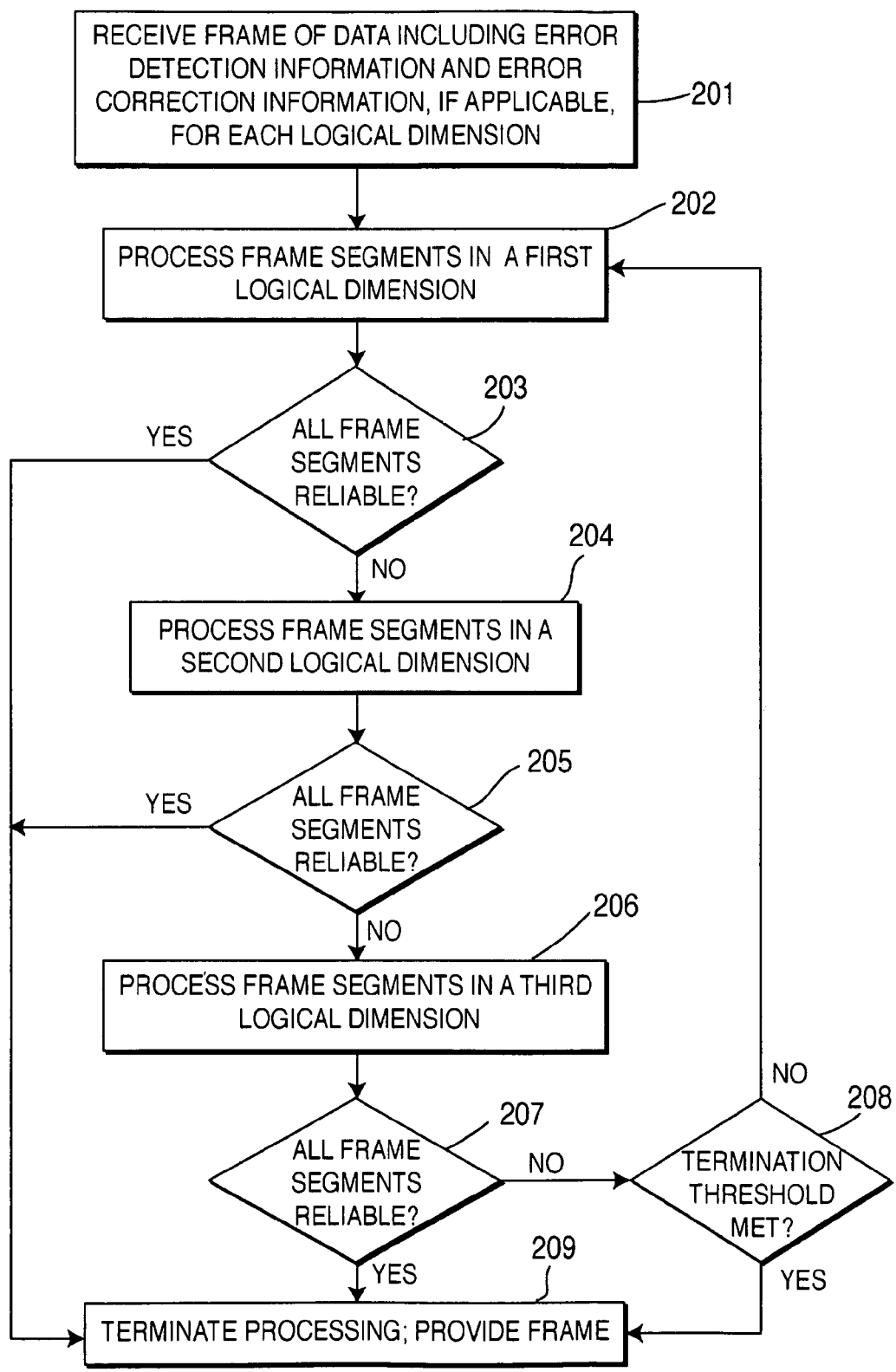
FIG. 2 shows a method of iterative decoding in accordance with exemplary embodiments of the present invention.

FIG. 1 shows an exemplary multi-logical dimension encoding of received data that might be iteratively decoded by the method of FIG. 2. FIG. 2 shows a method of iterative decoding in accordance with exemplary embodiments of the present invention. As employed herein, the term "logical dimension" refers to a layer, or sub-layer, of a layered network architecture. Consequently, a first logical dimension of coding might refer to error detection in a packet frame at the data link layer, while a second logical dimension of coding might refer to error detection/correction at a transport layer.

Referring to FIG. 1, the data frame and error detection or error detection/correction information are stored in table 101 of K (=10) columns and R (=11) rows. Since a data frame might be of variable length, table 101 might employ padding of columns with zeros (e.g., col. 7, row 8 through col. 9, row 11 are shown in FIG. 1 padded with zeros). Entries of table 101 may be one or more bits wide, and, for the exemplary table of FIG. 1, are one byte wide. Bytes of a data frame are stored in columns 1 through 7, where the data frame includes frame error (FE) indicator 102 appended at the end of the data frame associated with encoding in a first logical dimension. FE indicator 102 might be, for example, a cyclic redundancy check (CRC) value calculated over the data frame. The data frame might be, for example, a packet generated at the logical link control (LLC) sub-layer of the data-link layer (first logical dimension).

In accordance with an error detection/correction code in a second logical dimension, the data frame is divided into (e.g., ten) frame segments, where the nth frame segment includes corresponding error detection (ED) indicator EDn. ED indicator EDn might also be, for example, a CRC value. The frame segments might be, for example, medium access control (MAC) layer packets generated at the MAC sub-layer of the data-link layer (second logical dimension).

In a third logical dimension, an error detection and error correction code (error detection/correction code) is employed. As shown in FIG. 1, an error correction/detection (EDC) value is calculated for each row (EDC1 through EDC11). The EDC value allows for location identification and correction of up to a predefined number of bit errors. In addition, as is known in the art, if specific bytes of a row can be identified as containing one or more bits in error, then the error correction capability of the EDC value might be increased. The error detection/correction code might be, for example, a Reed-Solomon encoding generated at the physical layer (third logical dimension).

Once row error detection/correction values EDC1 through EDC11 are generated, the bytes of table 101 are read out (e.g., row wise, column-wise, or predetermined packet order), modulated, and transmitted through a communications medium. Various channel impairments might cause errors in one or more bits of the transmitted byte sequence, which sequence with errors is detected at a receiver. Errors in detection at the receiver might cause further errors in the sequence. The receiver then provides a sequence of bytes of detected bits corresponding to the transmitted bytes.

Given the received data organized as in FIG. 1, but containing one or more bytes in error, iterative decoding for multi-logical dimension received data is shown in FIG. 2. At step 201, the frame of data is received along with i) error detection or ii) error detection and correction information for each of the logical dimensions of coding. Frame segments of data are organized into a decoding structure, such as the structure illustrated in FIG. 1.

At step 202, the frame segments are processed in accordance with the first logical dimension. For example, for the structure illustrated in FIG. 1, the frame error FE might be calculated over the entire received frame (for all frame segments) excluding bytes representing ED1 through ED10. At step 203, a test determines whether all frame segments are reliable (e.g., no errors). Thus, in the first logical dimension, the calculated FE might be compared to FE indicator 102 to see if the frame has no errors, obviating the need for further processing in other logical dimensions. If the test of step 203 determines that all frame segments are reliable, then the method advances to step 209. At step 209, the frame segments are grouped and provided as the output data frame.

If the test of step 203 determines that the calculated FE is not equivalent to FE indicator 102, then at least one error occurs in either the frame data or in FE indicator 102. If all frame segments are not reliable in the first logical dimension, then the method advances to step 204. At step 204, the frame segments are processed in accordance with the second logical dimension. For example, for the structure illustrated in FIG. 1, the ED value might be calculated for each frame segment. At step 205, a test determines whether one or more frame segments are reliable (e.g., no errors). Thus, in the second logical dimension, each calculated ED value might be compared to the corresponding one of ED1 through ED10 to see if the associated frame segment is in error. Bytes of each frame segment (and the frame segment itself) found to be in error are marked as unreliable. If the test of step 205 determines that all frame segments are reliable, then the method advances to step 209.

If the test of step 205 determines that one or more frame segments are unreliable, then the method advances to step 206. At step 206, the frame segments are processed in accordance with the third logical dimension. For example, for the structure illustrated in FIG. 1, the EDC value might be calculated for each row. Since the EDC value allows for both error detection and error correction, the EDC value might be employed to correct bit errors occurring in the row. However, the EDC value can only be employed when the number of bit errors does not exceed the maximum number permitted by the error detection/correction code of the third logic dimension. The code of the third logic dimension might employ knowledge of specific unreliable bytes (as indicated by the error detection information of other logic dimension codes) to improve error correction performance.

At step 207, a test determines whether all frame segments are reliable (e.g., no errors). Thus, in the third logical dimension, each calculated EDC value might be compared to the corresponding one of EDC1 through EDC11 to see if the associated row is in error. If the test of step 207 determines that all frame segments are reliable, then the method advances to step 209.

If the test of step 207 determines that all frame segments are not reliable, then the method advances to step 208. At step 208, the method calculates a termination metric and compares the termination metric to a threshold value. For example, the method might employ an iteration count as a threshold, terminating the iterative process after a fixed number of iterations. Alternatively, the method might employ a test to determine if no further frame segments transition from unreliable to reliable between the last two iterations, or might employ a maximum acceptable frame bit error rate (BER) as a threshold.

If the test of step 208 determines that the calculated termination metric does not meet the termination threshold, then the method advances to step 202 to begin another iteration of processing, possibly with one or more changed table entry values. If the test of step 208 determines that the calculated termination metric meets the termination threshold, then the method advances to step 209 to terminate processing and provide the processed frame.

While the exemplary embodiment shown and described with respect to FIGS. 1 and 2 includes encoding of data in three logical dimensions, the present invention is not so limited. One skilled in the art might extend the teachings herein to iterative decoding in any number N of logical dimensions, N a positive integer greater than 1, depending upon the specific application. In addition, while the first and second logical dimension codes provided only error detection and the third logical dimension code provided error detection and error correction, the present invention is not limited to this configuration. As would be apparent to one skilled in the art, any of a number of different error detection or error detection/correction code schemes known in the art might be selected at each logical dimension, and might be selected independently of one another. Further, the structure of FIG. 1 is only for the purposes of illustration, and other types of multi-logical dimension structures might be designed depending upon the application.

Given the exemplary embodiment described above with respect to FIGS. 1 and 2, a specific exemplary implementation as might be employed for systems operating in accordance with a DVB-H standard is now described. For the DVB-H standard, processing occurs above the data link and physical layers, and so the detected data at a receiver prior to processing in accordance with the following exemplary implementation might experience at least two levels of error detection and correction before beginning.

Figure 3:
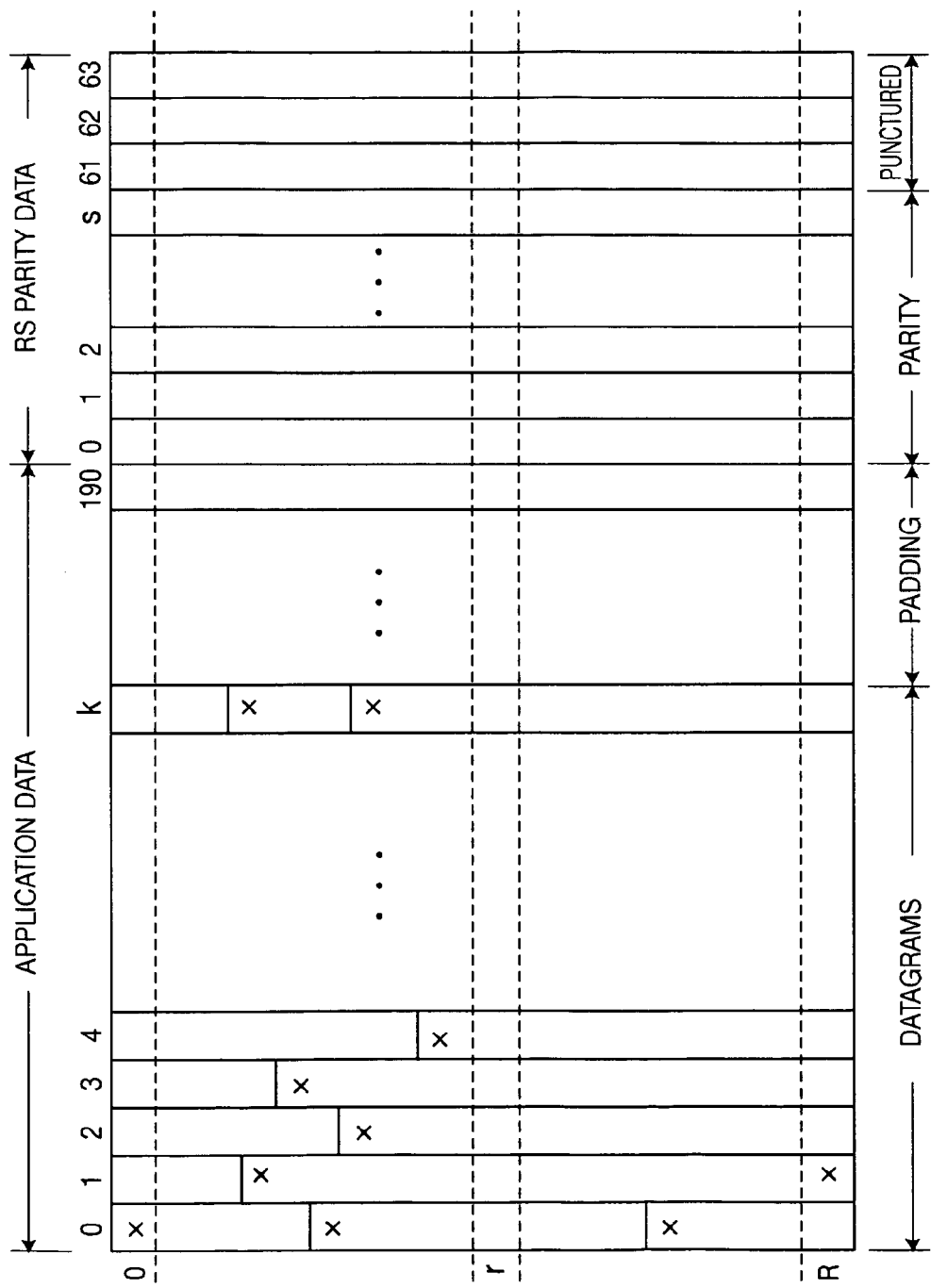
FIG. 3 shows multi-protocol encapsulated encoding with forward error correction that might be iteratively decoded by the method of FIG. 4.

Encoding of a DVB-H MPE FEC frame (corresponding to a time-slice burst) prior to transmission is as follows. Each MPE FEC frame includes a series of datagram sections ("datagrams"), where each datagram includes a 32-bit cyclic redundancy check (CRC) value calculated over the payload (data excluding the CRC value) of the datagram. A table with 191 data (byte) columns, 64 parity (byte) columns, and a variable number of rows R is constructed, as shown in FIG. 3. Each location in the table stores a byte of information (i.e., a byte of data or a byte of parity). The 191 data columns are filled by entering each MPE FEC datagram into the table on a column-by-column basis (an "x" in FIG. 3 shows the beginning of a datagram). When a column is filled with data from a current datagram, any remaining data from the current datagram is entered into the next column starting with the first row of the next column. Unused locations within the 191 data columns are filled with null bytes (padding). The 64 parity columns are filled with parity bytes of a (255,191,64) Reed-Solomon (RS) code, where the parity bytes of a row are calculated over the 191 data column byte entries of the row. Encoding/decoding of RS codes is well known in the art.

Transmission of the encoded DVB-H frame is as follows. Each of the MPE FEC frame datagrams is reconstructed (i.e., the original datagram packets are formed). Data in each parity column is constructed as an MPE FEC section (i.e., packets are formed to transport the parity and related FEC data), where each MPE FEC section also has an associated 32-bit CRC value. MAC-layer address fields of each datagram contain parameters that indicate the starting position in the data table of the corresponding datagram. At least one datagram includes information defining the table boundaries for use by a receiver, and might also include information as to the number of padding bytes. The number of rows is transmitted in a time slice FEC identifier, and the number of columns might be transmitted in the header of each MPE FEC section.

Alternatively, a receiver might determine the number of columns by tracking the sizes and the number of datagrams. Empty bytes (e.g., padding bytes) are not transmitted, and in some cases some of the parity columns (punctured columns of FIG. 3) might not be transmitted. Such parity bytes might not be transmitted when, for example, the communication channel exhibits very high SNR, the RS decoding might handle a number of errors in the parity bytes of a row since actual bit errors in the data columns are very unlikely (negligible BER).

Figure 4:
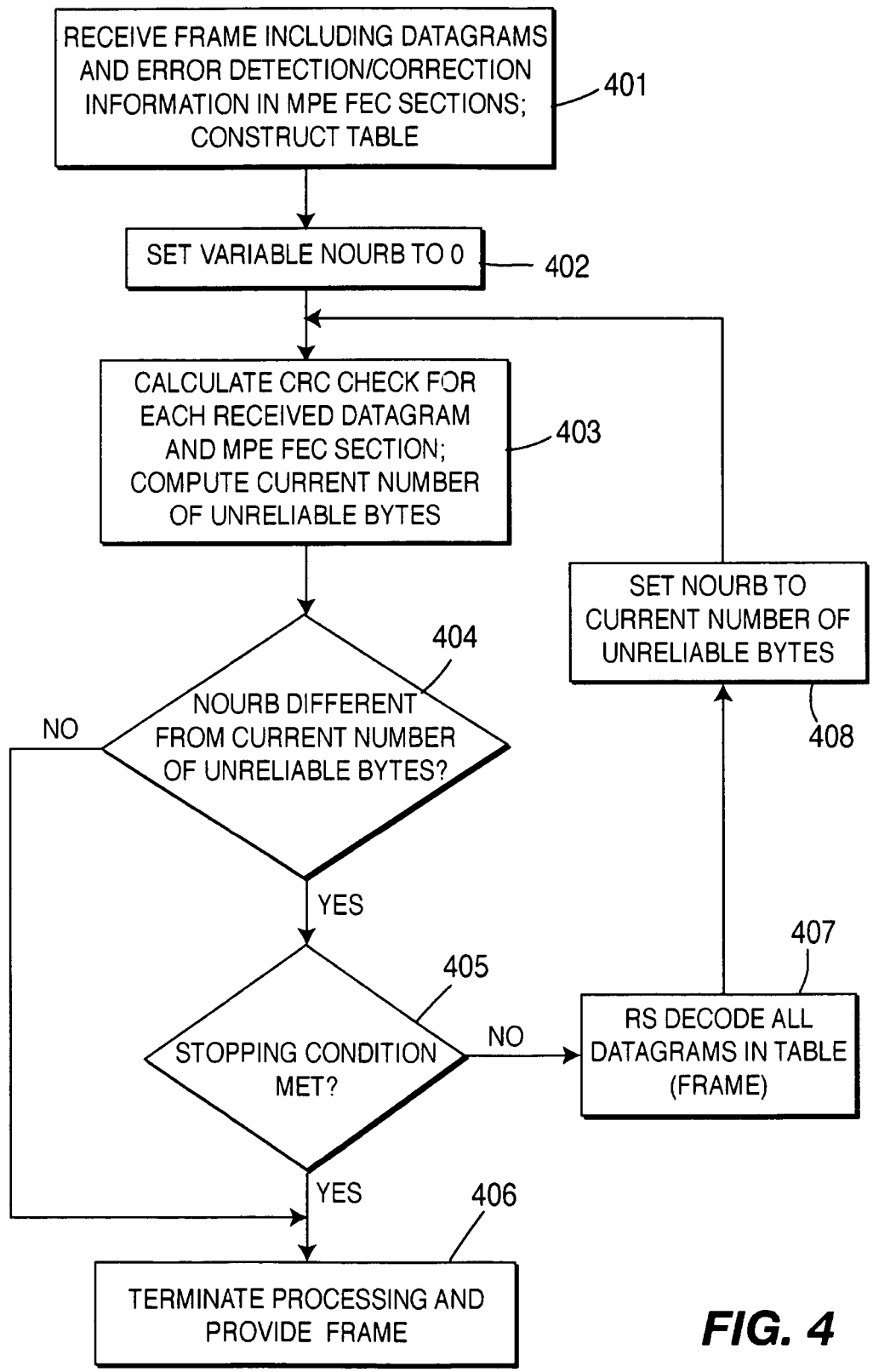
FIG. 4 shows an iterative decoding method as may be employed for the exemplary implementation of FIG. 3.

FIG. 4 shows an iterative decoding method as may be employed for the exemplary implementation of FIG. 3. At step 401, a receiver detects the datagrams and error detection/correction information including the MPE FEC sections and time slice FEC identifier, for which the table of FIG. 3 is reconstructed, which table might include errors inserted into the data during transmission.

At step 402, the variable NOURB (Number Of Unreliable Bytes) is set to 0, which variable is employed to track the improvement in error correction during the iterative decoding process.

At step 403, error detection in the first logical dimension occurs through verification of the CRC value for each datagram and each MPE FEC section. Since the CRC value of a datagram is calculated over all data bytes at the datagram, the receiver marks all payload bytes of a datagram or MPE FEC section as unreliable (as an "erasure") when a corresponding CRC value fails the verification check. Also, bytes belonging to datagrams and MPE FEC sections that are lost in transmission are marked as unreliable. Punctured parity bytes are set to null and marked unreliable. Null padding bytes are marked reliable. The number of bytes marked as "unreliable" by error detection in the first dimension is calculated.

At step 404, a test determines whether the number of bytes marked as "unreliable" by error detection in the first logical dimension is different from the value of the variable NOURB. A reduction in the number of unreliable bytes indicates that the previous iteration of decoding error-corrected one or more bytes. If the test of step 404 determines that no reduction in the number of corrected bytes occurred, then the method advances to step 406. At step 406, the iterative method terminates and the reconstructed, error-corrected datagrams are provided as the decoded data frame.

If the test of step 404 determines that the number of bytes marked as "unreliable" by error detection in the first dimension is smaller than the value of the variable NOURB, then the method advances to step 405. At step 405, a test determines whether a stopping condition has been met. One stopping condition is when all of the bytes are reliable. Depending on the particular implementation, other possible stopping conditions include achieving a specified BER level for the segments, implementing a specified number of iterations, and/or achieving a threshold based on a specified number of unreliable segments.

If the test of step 405 determines that a stopping condition is met, then the method advances to step 406.

If the test of step 405 determines that none of the stopping conditions are met, then, at step 407, error detection and correction in the second logical dimension occurs through RS decoding. First, for each row, each unreliable byte determined through the CRC value verification process of the first dimension is considered an erasure for RS decoding. If the new number of erasures is less than or equal to the minimum code distance (64, for the exemplary RS code herein), then the error correction proceeds as follows: an erasure locator polynomial is calculated, a syndrome polynomial is calculated, and then the erasures (bytes) are corrected based on the erasure locator and syndrome polynomials using a Fourney algorithm. Such techniques are described in, for example, Lin & Costello, Error Control Coding: Fundamentals & Applications, 1983, Prentice Hall, Inc., Section 6.5, pp. 170-177, the teachings of which are incorporated herein by reference.

At step 408, the variable NOURB is set to the number of unreliable bytes calculated at step 403, and the method returns to step 403 to begin the next iteration of iterative decoding.

Figure 5:
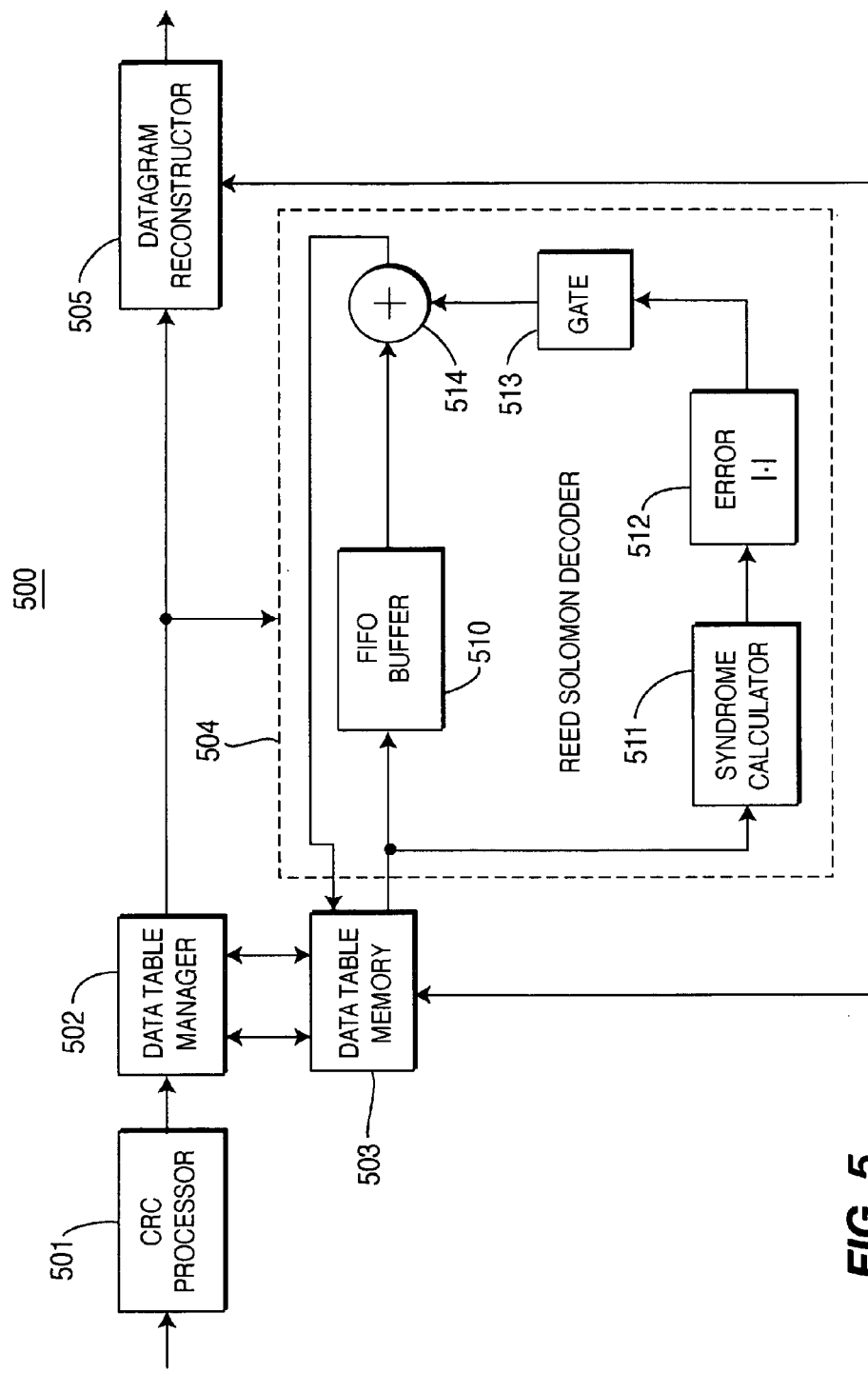
FIG. 5 shows a block diagram of a processor implementing iterative decoding in accordance with FIG. 4.

FIG. 5 shows a block diagram of MPE FEC packet decoder 500 implementing iterative decoding in accordance with FIG. 4. MPE FEC packet decoder 500 comprises CRC processor 501 employed to perform CRC verification in the first logical dimension, RS decoder 504, and datagram reconstructor 505.

MPE FEC packet decoder 500 further comprises data table manager 502 and data table memory 503 employed to construct and store, in concert with RS decoder 504, a table (such as in FIG. 3) from received datagrams, time slice FEC identifiers, and MPE FEC sections. From the decoded table in data table memory 503, datagram reconstructor either provides MPE packets or IP datagrams. MPE packets are constructed from the MPEG-2 transport stream (TS). Constructing rows of the table may be accomplished by two methods. In a first method, MPE packets are provided, and explicit construction of the entire table at once is avoided, by decoding on a row-by-row basis. In the first method, memory is allocated for one row, and the row is filled dynamically before RS decoding of the row. In a second method, IP datagrams are provided, and the table is constructed by filling the locations directly from the parsed MPEG-2 TS. Rows are decoded, and IP datagrams are provided from the table. The second method might employ a data structure indicating the position and length of each datagram in the table for reconstructing IP datagrams at the end of RS decoding.

RS decoder 504 is shown in FIG. 5 as comprising first-in, first-out (FIFO) buffer 510 (storing the datagram and parity bytes for a row), syndrome calculator 511, error magnitude calculator 512 (to generate the magnitude of the error at each location), gate 513, and combiner 514. As such, RS decoder 504 implements a Berlekamp-Massey algorithm, avoiding computation of the erasure locator polynomial by using row decoding using Galois field operations with table look-up. However, one skilled in the art might substitute other implementations for RS decoder 504.

Iterative decoding in accordance with one or more embodiments of the present invention might provide the following advantages. Iterative decoding might increase the number of corrected data errors, increasing the overall coding gain, and reduce the number of discarded packets at higher layers. Consequently, performance of systems employing embodiments of the present invention might be significantly improved over prior art systems.

As would be apparent to one skilled in the art, the various functions of iterative decoding may be implemented with circuit elements or may also be implemented in the digital domain as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method of processing segments of a frame of data, the method comprising:
  receiving the frame of data, including error detection information;
  processing the frame of data in a first logical dimension and determining a number of unreliable segments in the frame of data based on the error detection information;
  comparing the determined number of unreliable segments in the first logical dimension to a threshold; and on a condition the number of unreliable segments exceeds the threshold, processing the frame of data in a second logical dimension based on the one or more unreliable segments and error detection information, wherein the first and second logical dimensions correspond to different layers or sub-layers of a layered network architecture.

2. The method of claim 1, wherein the first logical dimension is a physical layer and the second logical dimension is an IP layer.

3. The method of claim 1, further comprising comparing the determined number of unreliable segments in the second logical dimension to a second threshold; and
on a condition the number of unreliable segments exceeds the second threshold, processing the frame of data in a second logical dimension based on the one or more unreliable segments in the second logical dimension and error detection/correction information.

4. The method of claim 1, further comprising repeating the processing and comparing for the data frame until a stopping condition is met.

5. The method of claim 1, wherein the encoding in the first logical dimension includes one or more cyclic redundancy check (CRC) values for one or more corresponding segments.

6. The method of claim 5, wherein the encoding in the second logical dimension is a convolutional encoding of the segments.

7. The method of claim 6, wherein the encoding in the second logical dimension is one of a Reed-Solomon encoding, a turbo encoding, and an LDPC encoding.

8. The method of claim 1, wherein the encoding in the second logical dimension is a convolutional encoding of the segments.

9. The method of claim 4, wherein the stopping condition is at least one of (1) all segments being reliable, (2) achieving a specified bit error rate (BER) level for the segments, (3) implementing a specified number of iterations, and (4) achieving a threshold based on a specified number of unreliable segments.

10. The method of claim 1, wherein the method is embodied in a processor of an integrated circuit.

11. The method of claim 1, wherein the segments represent a portion of a digital television signal having data encoding and modulation in accordance with a Digital Video Broadcast (DVB) standard.

12. Apparatus for processing segments of a frame of data, the apparatus comprising:
a receiver configured to receive the frame of data, including error detection information;
circuitry configured to process the frame of data in a first logical dimension and determining a number of unreliable segments in the frame of data based on the error detection information;
circuitry configured to compare the determined number of unreliable segments in the first logical dimension to a threshold; and
circuitry configured to, on a condition the number of unreliable segments exceeds the threshold, process the frame of data in a second logical dimension based on the one or more unreliable segments and error detection information, wherein: the first and second logical dimensions correspond to different layers or sub-layers of a layered network architecture.

13. The method of claim 12, wherein the first logical dimension is a physical layer and the second logical dimension is an IP layer.

14. The method of claim 12, wherein:
the encoding in the first logical dimension includes one or more cyclic redundancy check (CRC) values for one or more corresponding segments; and
the encoding in the second logical dimension is a convolutional encoding of the segments.

15. The method of claim 14, wherein the encoding in the second logical dimension is one of a Reed-Solomon encoding, a turbo encoding, and an LDPC encoding.

16. The method of claim 12, wherein the apparatus is embodied in an integrated circuit.

17. The method of in claim 16, wherein the apparatus is embodied in a demodulator of a handheld device.

18. A non-transitory computer-readable medium having stored thereon a plurality of instructions, the plurality of instructions including instructions which, when executed by a processor, cause the processor to implement a method for processing segments of a frame of data, the method comprising:
receiving the frame of data, including error detection information;
processing the frame of data in a first logical dimension and determining a number of unreliable segments in the frame of data based on the error detection information;
comparing the determined number of unreliable segments in the first logical dimension to a threshold; and
on a condition the number of unreliable segments exceeds the threshold, processing the frame of data in a second logical dimension based on the one or more unreliable segments and error detection information, wherein the first and second logical dimensions correspond to different layers or sub-layers of a layered network architecture.

* * * * *